United States Patent
Adachi et al.

[11] Patent Number: 5,885,937
[45] Date of Patent: Mar. 23, 1999

[54] SUPERCONDUCTING TUNNEL JUNCTION ELEMENT AND SUPERCONDUCTING DEVICE

[75] Inventors: Hideaki Adachi; Masahiro Sakai, both of Osaka; Akihiro Odagawa, Nara; Kentaro Setsune, Osaka, all of Japan

[73] Assignee: Matsushita Electric Industrial Co., Ltd., Osaka, Japan

[21] Appl. No.: 888,657

[22] Filed: Jul. 7, 1997

[30] Foreign Application Priority Data

Jul. 9, 1996 [JP] Japan .................................. 8-178891
Dec. 18, 1996 [JP] Japan .................................. 8-338651

[51] Int. Cl.$^6$ .................................................. H01L 39/22
[52] U.S. Cl. ........................ 505/190; 505/329; 257/33; 257/35; 427/62
[58] Field of Search ......................... 505/190, 329; 427/62, 63; 257/33, 35

[56] References Cited

U.S. PATENT DOCUMENTS 5,061,971 10/1991 Takemura .
5,362,709 11/1994 Takemura .
5,488,030 1/1996 Tanaka et al. .
5,565,415 10/1996 Matsuura et al. .

FOREIGN PATENT DOCUMENTS 0 342 038 11/1989 European Pat. Off. .
0 468 868 1/1992 European Pat. Off. .

OTHER PUBLICATIONS

K. Tanabe et al., "Observation of both pair and quasiparticle tunneling in intrinsic junction stacks fabricated on $Bi_2Sr_2CaCu_2O_8$ and δ single crystals", ©The American Physical Society, Physical Review B, vol. 53, No. 14, Apr. 1, 1996, (pp. 9348–9352).

Takada, "Present Status of High Temperature Superconducting Electron Device", 1993 (pp. 443–454), with *Verification of Translation*, 1997, (pp. 1–9).

Mizuno et al, Appl. Phys. lett. 56(15) Apr. 1990, pp. 1469–1471.

Mizuno et al, Jpn. J. Appl. Phys. vol. 30, No. 9A, Sep. 1991, pp. L1559–L1561.

Cucolo et al, Appl. Phys. lett. 68(2), Jan. 1996, pp. 253–255.

*Primary Examiner*—Roy V. King
*Attorney, Agent, or Firm*—Merchant, Gould, Smith, Edell, Welter & Schmidt, P.A.

[57] ABSTRACT

This invention provides a superconducting tunnel junction element showing satisfactory Josephson effect. The element includes a Bi-based layered compound such as $Bi_2Sr_2(Ca_{0.6}Y_{0.4})Cu_2O_8$, $Bi_2Sr_2Cu_2O_6$ and $Bi_2Sr_2CaCu_2O_8$ as the barrier layer between the superconducting oxide electrodes. The structural matching of the superconducting oxide with the Bi-based compound is supposed to be good. Some kinds of Cu-based superconducting oxides such as $YSr_2Cu_{2.7}Re_{0.3}O_7$, $Sr_2CaCu_2O_6$ and $(La_{0.9}Sr_{0.1})_2CuO_4$ are used for the electrodes to obtain a Josephson element which can work at a high temperature. When using the superconducting oxides including Ba such as $YBa_2Cu_3O_7$ for the electrode, forming a thin film between the electrode and the barrier is better to prevent Ba from reacting with Bi in the barrier layer. The superconducting device comprising the element has various uses such as magnetic detecting use, communicating use and computing use.

22 Claims, 7 Drawing Sheets

SUPERCONDUCTING TUNNEL JUNCTION ELEMENT AND SUPERCONDUCTING DEVICE

FIELD OF THE INVENTION

This invention relates to a superconducting tunnel junction element and a superconducting device including the element. More particularly, this invention relates to a superconducting tunnel junction element which provides a good Josephson effect and a superconducting device expected to operate quickly and sensitively in an apparatus such as a magnetic detector, a submillimeter wave signal processing device and a superconducting computer.

BACKGROUND OF THE INVENTION

Some of the superconducting oxides found recently have a superconducting critical temperature (Tc) higher than the boiling point of liquid nitrogen so that the applications of superconductors have been broadened significantly. Getting a superconducting device expected to be applied in an electronics field, some kinds of superconducting junctions are produced on a trial basis as a basic element of the device. The junctions are, for example, those which utilize in-plain grain boundaries, those which utilize the differences of surfaces like steps and those of a multilayer-type (S:Takada, *Oyo Buturi*, vol.62, 1993, p443).

The superconducting junctions which have been produced so far, however, have not provided a satisfactory effect. In other words, tunnel junction elements showing an ideal Josephson characteristics have been hard to obtain. This is because it is technically hard to completely get rid of disorder from tunnel junctions due to the contacts between superconducting compounds and non-superconduting compounds especially when including a composite oxide showing a high Tc. Though it was reported that a single crystal of Bi-based superconducting oxide showed characteristics like tunnel junction ( K. Tanabe et al, Physical Review B, vol.53, No.14, April 1996), the characteristics were observed only in the single crystal so that it was hard to apply it to a useful element or device in an electronics field.

As described above, it has been hard to produce a tunnel junction element which can be applied to a superconduting device. In order to get a good contact between a superconduting layer and a non-superconducting layer and make the element practical, it is necessary that the compounds of the layers are compatible and the element is not hard to produce. A tunnel junction element including a niobium (Nb) layer known as a superconducting metal, was not actually realized until a superb combination of the metal as electrodes and an aluminium oxide as a barrier layer was discovered. Such a superb combination including a superconducting oxide has been hard to produce, to date.

SUMMARY OF THE INVENTION

An object of the present invention is to provide a high-efficiency superconducting tunnel junction element including a superconducting oxide and a superconduting device including the element.

The above object of the present invention is achieved in accordance with the present invention by a superconducting tunnel junction element which comprises a pair of superconducting electrodes, each comprising a composite oxide as a main component; and a barrier layer between the electrodes, comprising a composite oxide as a main component represented by the following formula:

$$Bi_2A_{m+1}Cu_mO_{2m+4} \quad (1),$$

wherein A represents at least one alkali earth element and m represents an integer between one and four.

According to the superconducting tunnel junction element, the composite oxide represented by the above formula (1) was used for the barrier layer instead of the oxides having a perovskite structure like strontium titanate ($SrTiO_3$) which have been tried to apply to the barrier layer to improve junction characteristics and get a good Josephson effect. A superconducting device of the present invention comprises the above superconducting tunnel junction element to be high-efficient and practical in various fields. The main field is an electronics field, where the superconducting device can be used for magnetic detecting, communicating, computing and so on.

As described above, the present invention has been completed by discovering the above composite oxide is highly suitable for the barrier layer between superconduting oxide electrodes, the same as aluminium oxide is for the barrier layer between superconducting metal (Nb) electrodes. As the element of the present invention can work at a higher temperature, the superconducting device including the element is more useful as a basic element part in superconducting electronics.

BRIEF DESCRIPTION OF THE DRAWINGS

This invention can be better understood from the following detailed description when read in conjunction with the drawing in which.

DESCRIPTION OF THE PREFERRED EMBODIMENTS

Figure 1:
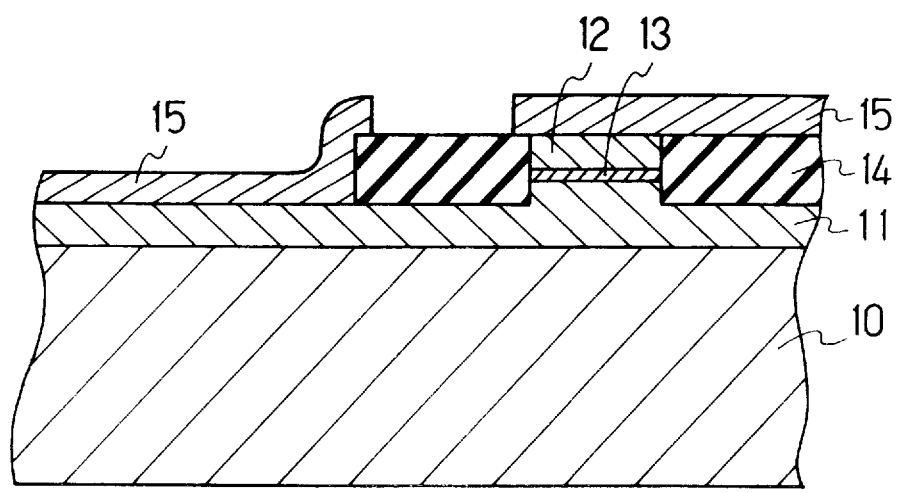
FIG. 1 is a cross sectional view showing a superconducting tunnel junction element in accordance with the present invention.

The superconducting tunnel junction element according to the present invention comprises an upper superconducting electrode, a lower superconducting electrode layer and a barrier layer between the two electrodes.

It is preferable in the superconducting tunnel junction element that the thickness of the barrier layer is between 1 nm and 20 nm to make the superconductive characteristics better.

It is preferable in the superconducting tunnel junction element that the electrodes are free from barium (Ba), because there is a fear that barium reacts with bismuth (Bi) to produce a stable impure layer.

It is preferable in the superconducting tunnel junction element that the composite oxide in each of the superconducting electrodes is represented by the following formula (2) or (3):

$$R^1Sr_2Cu_{3-x}M_xO_{7-d} \quad (2),$$

wherein $R^1$ represents at least one rare earth element, preferably at least one rare earth element selected from the group consisting of lanthanum (La), neodymium (Nd), samarium (Sm), europium (Eu), gadolinium (Gd), terbium (Tb), dysprosium (Dy), holmium (Ho), erbium (Er), thulium (Tm), ytterbium (Yb), lutetium (Lu) and yttrium (Y), M represents at least one element selected from the group consisting of molybdenum (Mo), tungsten (W), rhenium (Re), germanium (Ge), iron (Fe), cobalt (Co), chromium (Cr) and titanium (Ti), x represents a numerical value between zero and one and d represents a numerical value between zero and one;

$$Sr_2Ca_{n-1}Cu_nO_{2n+2} \quad (3),$$

wherein n represents an integer between one and five.

It is preferable in the superconducting tunnel junction element that a layer for structural stabilization (a stabilizer) is formed between the superconducting electrode and the barrier layer. It is preferable that the layer for structural stabilization is free from barium (Ba) because of the same fear as described above. The layer for structural stabilization is typically an oxide layer, and preferably a layer comprising composite oxide represented by the above formula (2) or (3), or the following formula (4):

$$L_2CuO_{3+f} \quad (4),$$

wherein L represents at least one element selected from the group of lanthanum (La) and strontium (Sr) and f represents a numerical value between zero and 1.2.

It is preferable that the layer for structural stabilization is thinner than the barrier layer, more specifically the thickness of the layer is preferably between 0.7 nm and 10 nm, because the element is improved in property.

In the case of the layer for structural stabilization is formed between the superconducting electrode and the barrier layer, in addition to the composite oxides represented by the above formula (2) or (3), other composite oxides are preferably used for a main component of the superconducting electrodes. The other composite oxides are, for example, represented by the following formula:

$$R^2Ba_2Cu_3O_{7-e} \quad (5),$$

wherein $R^2$ represents at least a rare earth element, preferably at least one element selected from the group of lanthanum (La), neodymium (Nd), samarium (Sm), europium (Eu), gadolinium (Gd), dysprosium (Dy), holmium (Ho), erbium (Er), thulium (Tm), ytterbium (Yb), lutetium (Lu) and yttrium (Y) and e represents a numerical value between zero and one. When using the composite oxide represented by the formula (5), a higher Tc is observed.

The barrier layer of the present invention can provide a good tunnel junction. In the barrier layer, when an alkali earth element (A) is substituted with at least one rare earth element ($R^3$), that is, when the composite oxide in the barrier layer is represented by the formula of $Bi_2(A,R^3)_{m+1}Cu_mO_{2m+4}$, the element is improved in property and is more easily made because the structural matching is progressed. The barrier layer is more preferably represented by the formula of $Bi_2(Sr,Ca,R^3)_{m+1}Cu_mO_{2m+4}$. It is preferable that $R^3$ is at least one element selected from the group of lanthanum (La), neodymium (Nd), samarium (Sm), europium (Eu), gadolinium (Gd), dysprosium (Dy), holmium (Ho), erbium (Er), thulium (Tm), ytterbium (Yb), lutetium (Lu) and yttrium (Y).

Where the composite oxide having the same type of structure as that represented by the formula (2) is used for the superconducting electrode, exemplarly composite oxides include $YSr_2Cu_{2.7}Re_{0.3}O_7$, $YSr_2Cu_{2.7}W_{0.3}O_7$, $YSr_2Cu_{2.7}Mo_{0.3}O_7$ and the same kinds of oxides in structure as the above oxides, e.g. the oxides in which another rare earth element or calcium (Ca) substitutes for at least a part of yttrium (Y), the oxides in which the element such as germanium (Ge), iron (Fe), cobalt (Co), chromium (Cr) and titanium (Ti) substitutes for rhenium (Re), molybdenum (Mo) or tungsten (W).

Where the composite oxide represented by the formula (2) is used for the superconduting electrode, the subsutitution of rare earth element for a part of alkali earth element in the composite oxide in the barrier layer stabilizes the structure of the superconducting tunnel junction element so that the reproducibility is increased. In the case of such a substitution, rare earth element ($R^1$) may be substituted with calcium (Ca) in the composite oxide represented by the formula (2).

Where the composite oxide having the same type of structure as that represented by the formula (3) is used for the superconducting electrode, a part of calcium (Ca) may be substituted with strontium (Sr). When substituting for all the calcium, that is, when the oxide is represented by the formula of $Sr_{n+1}Cu_nO_{2n+2}$, a satisfactory superconducting tunnel junction element can be produced, because the good structural matching is maintained.

When substituting a halogen element such as fluorine (F), chlorine (Cl) and bromine (Br) for a part of oxygen (O) in the composite oxide represeted by the formula of (3), the superconductive property and the reproducibility of the superconducting tunnel junction element is increased.

When substituting a rare earth element for at least a part of strontium (Sr) in the composite oxide represented by the formula of (3), e.g. $(La,Sr)_2Ca_{n-1}Cu_nO_{2n+2}$, the stability of the structure is improved to make it possible to obtain a better superconducting element. In addition to lanthanum (La), other rare earth elements such as neodymium (Nd), praseodymium (Pr) and cerium (Ce) can be substituted for strontium (Sr). The composite oxide represented by the formula of $R^4CuO_4$, wherein $R^4$ represents at least one kind of rare earth elements, preferably at least one element selected from the group of lanthanum (La), neodymium (Nd), praseodymium (Pr) and cerium (Ce), can be also applied.

Where the composite oxide having the same type of structure as that represented by the formula (5) is used for the superconducting electrode, exemplary composite oxides include $YBa_2Cu_3O_7$, $EuBa_2Cu_3O_7$, $NdBa_2Cu_3O_7$ and the same kinds of oxides in structure as the above oxides. Exemplary oxides that can be used for structural stabilization include $La_2CuO_4$, $Sr_2CuO_3$ and solid solutions of these oxides. The layer can make the structural and chemical matching between the superconducting electrode and the barrier layer much better to make it possible to produce a superconducting element which has good reproducibility and superconducting property.

Exemplary methods of producing the layers of the present invention, such as the electrodes, the barrier layers, and the layers for structural stabilization include an atomic layer growth method by reactive vapor deposition, a sputtering method and so on.

Where each superconducting electrode of the superconducting tunnel junction element combines with an upper or lower electrode to be a superconducting device, the device shows good superconducting properties.

As a superconducting device, the superconducting tunnel junction element of the present invention has a wide use for measuring apparatus, communication apparatus, superconducting computing and other apparatuses in the fields as the above apparatuses belong to.

Figure 6:
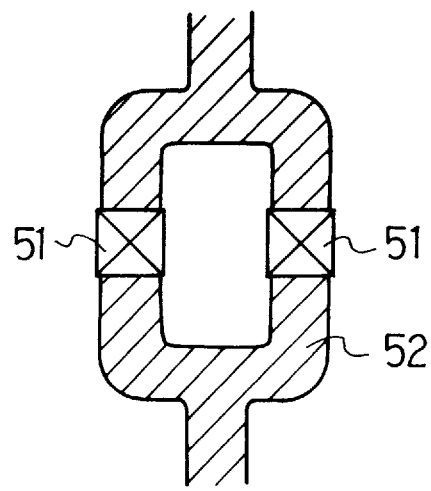
FIG. 6 is a plan view showing a superconducting quantum interference device (SQUID) including a superconducting tunnel junction element in accordance with the present invention.

As a superconducting device, there can be mentioned a magnetic detecting device including a superconducting quantum interference device (SQIUD). A superconducting quantum interference device has a closed loop consisting of two superconducting tunnel junction elements 51 and a superconducting film 52 as seen in FIG. 6. The Magnetic flux into the loop can be sensitively detected. The magnetic detecting device including the superconducting tunnel junction element of the invention is useful in a mineral search system and in detecting faint biomagnetism such as brain magnetism and cardiomagnetism by measuring systems such as a sensitive magnetic detecting apparatus.

Figure 7:
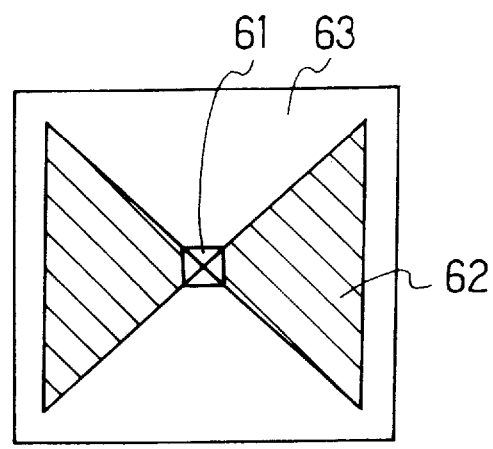
FIG. 7 is a plan view showing a millimeter wave detector including a superconducting tunnel junction element in accordance with the present invention.

Superconducting device also include a communication device such as a resonator, a filter and an antenna mainly for GHz band and THz band. The communication device including the superconductiung tunnel element of the invention provides a high performance as a signal processing device mainly for a submillimeter and millimeter wave which can detect, handle or process the wave signal, because the element has a good SIS (superconductor-insulator-superconductor) junction. The device is useful in the fields such as radio astronomy and global atmospheric research. An antenna, one of the communication devices, is shown in FIG. 7. The antenna on the substrate 63 comprises two triangle patterns 62 made of gold having sides at a length of about three millimeter and a common apex the triangles are symmetric with respect to. There is a superconducting tunnel element of the invention 61 at the apex.

Figure 8:
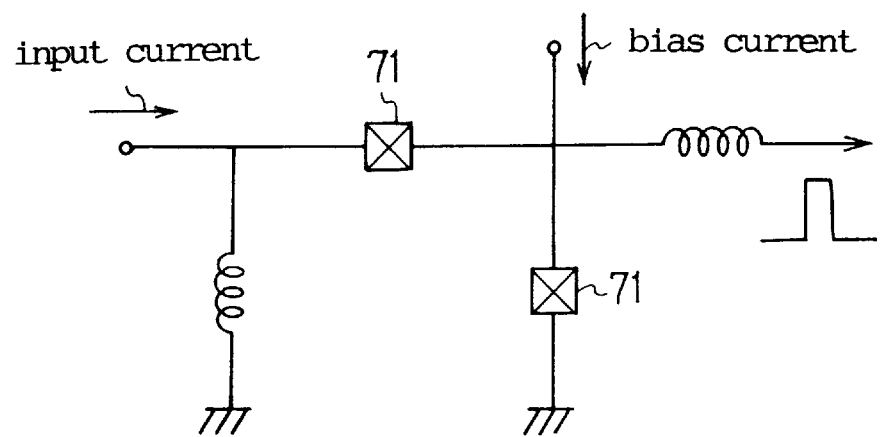
FIG. 8 is a circuit diagram showing a logic device including a superconducting tunnel junction element in accordance with the present invention.

Superconducting device also include a superconducting computer device. A logic device including a superconducting tunnel element of the invention, one of the superconducting computer devices, is shown in FIG. 8. The logic device including the element of the invention 71 as shown in FIG. 8 can control pulse voltage so well that the combination of such logic devices can constitute a memory or an operator.

The superconducting device of the invention is not considered to be limited to the devices described above and can apply to various kinds of apparatuses.

EXAMPLES

Example 1

A superconducting tunnel element was produced out of $YSr_2Cu_{2.7}Re_{0.3}O_7$ as a compound for superconducting electrodes and $Bi_2Sr_2(Ca_{0.6}Y_{0.4})Cu_2O_8$ as a compound for a barrier layer. The compound for superconducting electrodes, one of the superconductors what is called a 123 structure superconductors represented by the formula of $RSr_2(Cu,M)_3O_7$, wherein R represents rare earth element and M represents Mo, W, Re, Ge, Fe, Co, Cr or Ti, has a superconducting critical temperature (Tc) of about 50 K.

Thin films of the element were produced by a reactive vapor deposition method. The oxide thin films equivalent to an atomic layer were deposited and grown by an apparatus for forming thin films with vapor shutters, an ozon beam source and six vapor sources of Y, Sr, Ca, Cu, Bi and Re. The shutters controlled the vapor from each source independently and the ozone beam source supplied oxygen to a substrate surface. The substrate surface was a (100) plane of a strontium titanate ($SrTiO_3$) heated to 650° C. during deposition.

A $YSr_2Cu_{2.7}Re_{0.3}O_7$ thin film was formed as a lower superconducting electrode on the substrate. The shutters were controlled in the order of $(Re_{0.3}Cu_{0.7})$ →Sr→Cu→Y→Cu→Sr→$(Re_{0.3}Cu_{0.7})$ in cycles, while the substrate was irradiated by an ozone beam. The operation of 80 cycles made an about 100 nm of the lower electrode. The shutters were further controlled in the order of Sr→Cu→ $(Ca_{0.6}Y_{0.4})$→Cu→Sr→Bi→Bi→Sr→Cu→$(Ca_{0.6}Y_{0.4})$ →Cu→Sr in cycles to deposit a $Bi_2Sr_2(Ca_{0.6}Y_{0.4})Cu_2O_8$ thin film to a thickness of 2 nm as a barrier layer. The shutters were kept on being controlled in the order of $(Re_{0.3}Cu_{0.7})$→Sr→Cu→Y→Cu→Sr→$(Re_{0.3}Cu_{0.7})$ in cycles again to deposit a $YSr_2Cu_{2.7}Re_{0.3}O_7$ thin film to a thickness of 50 nm as an upper electrode. It was confirmed that the c-crystallographic axes in all the thin films were perpendicular to the surface of the substrate. This layered product was finely processed to be a junction element whose schematic sectional view was seen in FIG. 1. The layered product with an area of 3 $\mu$m×3 $\mu$m on the substrate 10 was cut out by an Argon etching to obtain a junction comprising the lower electrode 11, the upper electrode 12 and the barrier layer 13 between the electrodes. The electrodes 11, 12, from which matal electrodes 15 were leaded, were insulated with an insulating layer 14 made of deposited $CaF_2$.

Figure 2:
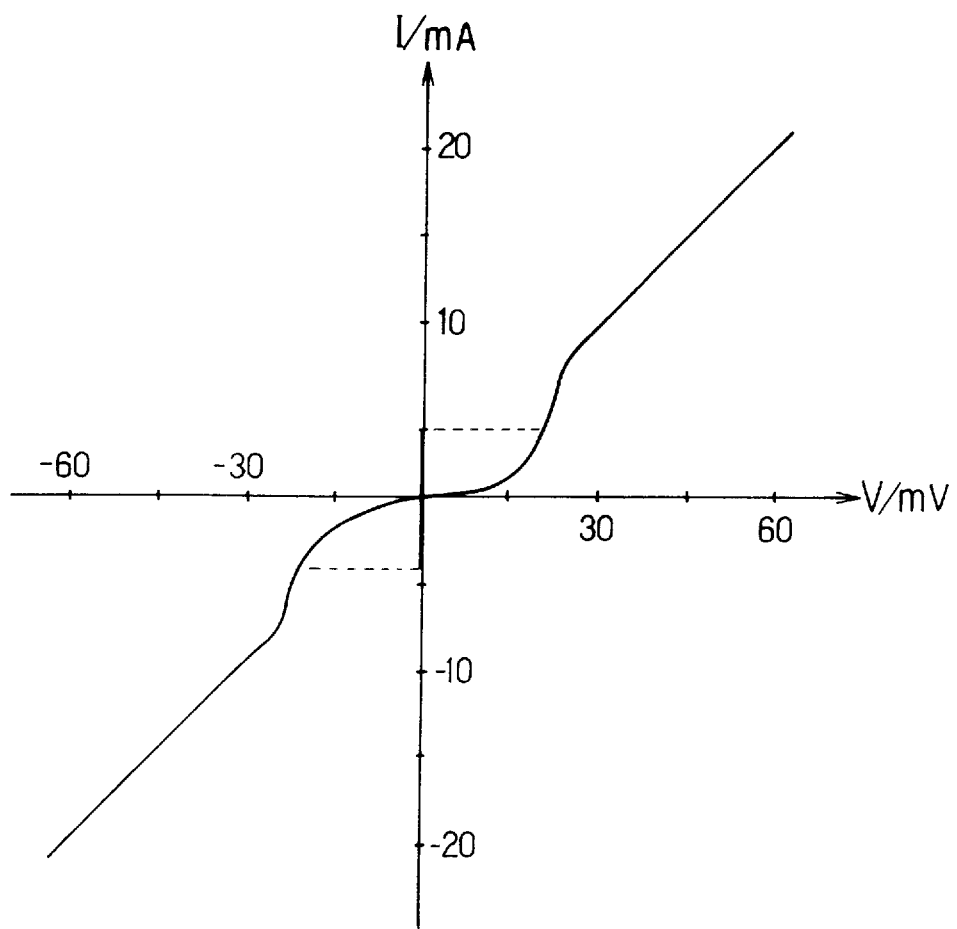
FIG. 2 is a graph showing V–I curve of a superconducting tunnel junction element in accordance with the present invention.

The electrical resistance of the $YSr_2Cu_{2.7}Re_{0.3}O_7$ electrode was zero at 27K. A typical Josephson effect with a clear hysteresis curve was found as seen in FIG. 2, when measuring voltage-current characteristics between the two electrodes of the element at 5K. As shown above, a satisfactory superconducting tunnel junction element with a Cu-oxide superconductor represented by the formula of $RSr_2(Cu,M)_3O_7$ can be produced by utilizing the good combination in structure between the superconducting electrode and the Bi-based barrier layer having a layer structure.

Though $YSr_2Cu_{2.7}Re_{0.3}O_7$ was used for the superconducting electrode in this example, the compound having the same type of structure as $YSr_2Cu_{2.7}Re_{0.3}O_7$ can be used, because the good matching is maintained. Y may be substituted with another rare earth element or Ca and Re may be substituted with Mo, W, Ge, Fe, Co, Cr, Ti and so on. By substituting the above Bi-based compound in the barrier layer with another simpler compound such as $Bi_2Sr_2CaCu_2O_8$, a superconducting tunnel junction was produced. By substituting a part of Ca with Y like the compound as described above, it was confirmed that the reproducibility was increased. When the compound represented by the formula of $Bi_2(Sr,Ca,R^3)_{m+1}Cu_mO_{2m+4}$ was used, the matching with the superconducting electrode was also maintained.

Example 2

A superconducting tunnel element was produced out of $Sr_2CaCu_2O_6$ (Tc=80K) as a compound for superconducting electrodes and $Bi_2Sr_2CaCu_2O_8$ as a compound for a barrier layer by the same process as described in Example 1.

The shutters were controlled in the order of Sr→Sr→Cu→Ca→Cu→Sr in cycles to grow an atomic layer of the oxide and deposit a thin film to a thickness of 100 nm as a lower superconducting electrode. The shutters were further controlled in the order of Bi→Bi→Sr→Cu→Ca→Cu→Sr→Bi in cycles to deposit a barrier layer. The shutters were controlled in the same order as growing the lower electrode to deposit a thin film to a thickness of 50 nm as an upper electrode.

In this example, Josephson effect was observed at a higher temperature of 30K. By investigating the influence of the thickness of the barrier layer, it was found that the barrier layer with a thickness between 1 nm and 20 nm made the reproducibility better.

Though $Sr_2CaCu_2O_6$ was used for the superconducting electrode in this example, the compound having the same structure as $Sr_2CaCu_2O_6$ can be used, because the good matching is maintained. Such compounds include the compound represented by the formula (3) and the compound represented by the formula of $Sr_{n+1}Cu_nO_{2n+2}$ wherein substituting all the Ca is substituted with Sr. In the case of substituting a part of oxygen (O) with halogen element such as F, Cl and Br, it was confirmed that the superconducting property and the reproducibility was increased.

The superconducting elements described above are produced by other methods like sputtering as described below.

Example 3

A superconducting tunnel element was produced out of $(La_{0.9}Sr_{0.1})_2CuO_4$ (Tc=40K) as a compound for superconducting electrodes and $Bi_2(La_{0.6}Sr_{0.4})_2CuO_6$ as a compound for a barrier layer by a sputtering method.

Figure 3A:
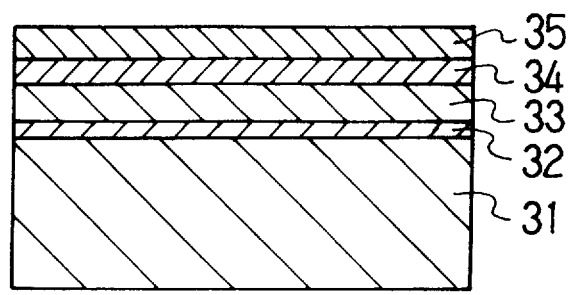
FIGS. 3A, 3B and 3C are cross sectional views showing a process for producing a superconducting tunnel junction element in accordance with the present invention.
Figure 3B:
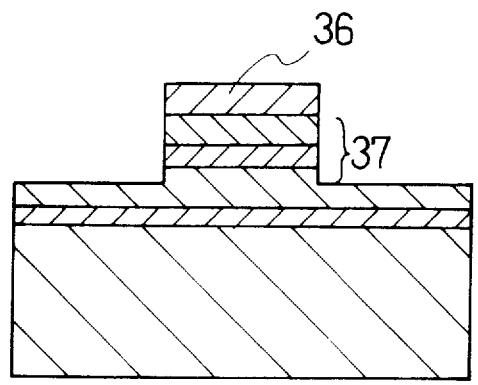
Figure 3C:
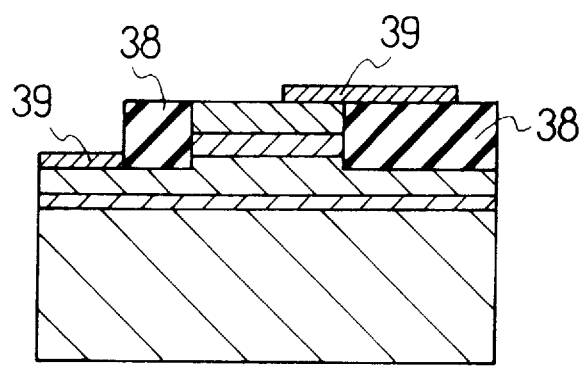

The sputtering targets represented by the formulas $(La_{0.9}Sr_{0.1})_2Cu_{1.2}O_{4.2}$ and $Bi_{2.4}(La_{0.6}Sr_{0.4})_2Cu_{1.2}O_7$ for each layer were placed in the same vessel. In the atmosphere of Ar including 20% of $O_2$ at a pressure of 0.5 Pa, thin films were deposited on the substrate heated to 600° C. by sputtering at a power of 50 W. The steps of the process for producing the element were shown in FIG. 3. First, a $Bi_2(La_{0.6}Sr_{0.4})_2CuO_6$ thin film, a Bi-based layer structure compound, was deposited on the (100) plane of the $SrTiO_3$ substrate 31 to a thickness of 50 nm as the buffer layer 32. Second, a $(La_{0.9}Sr_{0.1})_2CuO_4$ thin film was deposited on the buffer layer 32 to a thickness of 300 nm as the lower electrode 33. Third, a $Bi_2(La_{0.6}Sr_{0.4})_2CuO_6$ thin film was deposited on the lower electrode 33 as the barrier layer 34. Fourth, a $(La_{0.9}Sr_{0.1})_2CuO_4$ thin film was deposited on the barrier layer 34 to a thickness of 100 nm as the upper electrode 35. The thickness of the barrier layer 34 was selected between 0.4 nm and 100 nm. It was confirmed that the c-crystallographic axes in all the thin films were perpendicular to the surface of the substrate. The junction part 37 were cut out by an Argon etching after forming photoresist film 36 on an area of 5 μm×5 μm. A $CaF_2$ thin film was formed as the insulating layer 38, before the Ag electrodes 39 were leaded to the electrodes 33, 35.

The electrical resistance of the $(La_{0.9}Sr_{0.1})_2CuO_4$ electrode was zero at 38K. A typical Josephson effect with a clear hysteresis curve was found at 10K, when measuring voltage-current characteristics between the two electrodes of the element with a barrier layer at a thickness of 1.2 nm. Such a Josephson effect was observed with good producibility when the thickness of the barrier layer was between 1 nm and 20 nm. The structural matching between the superconductor and the Bi-based barrier layer was supposed to be so good that the safficiently effect was obtained.

Figure 4:
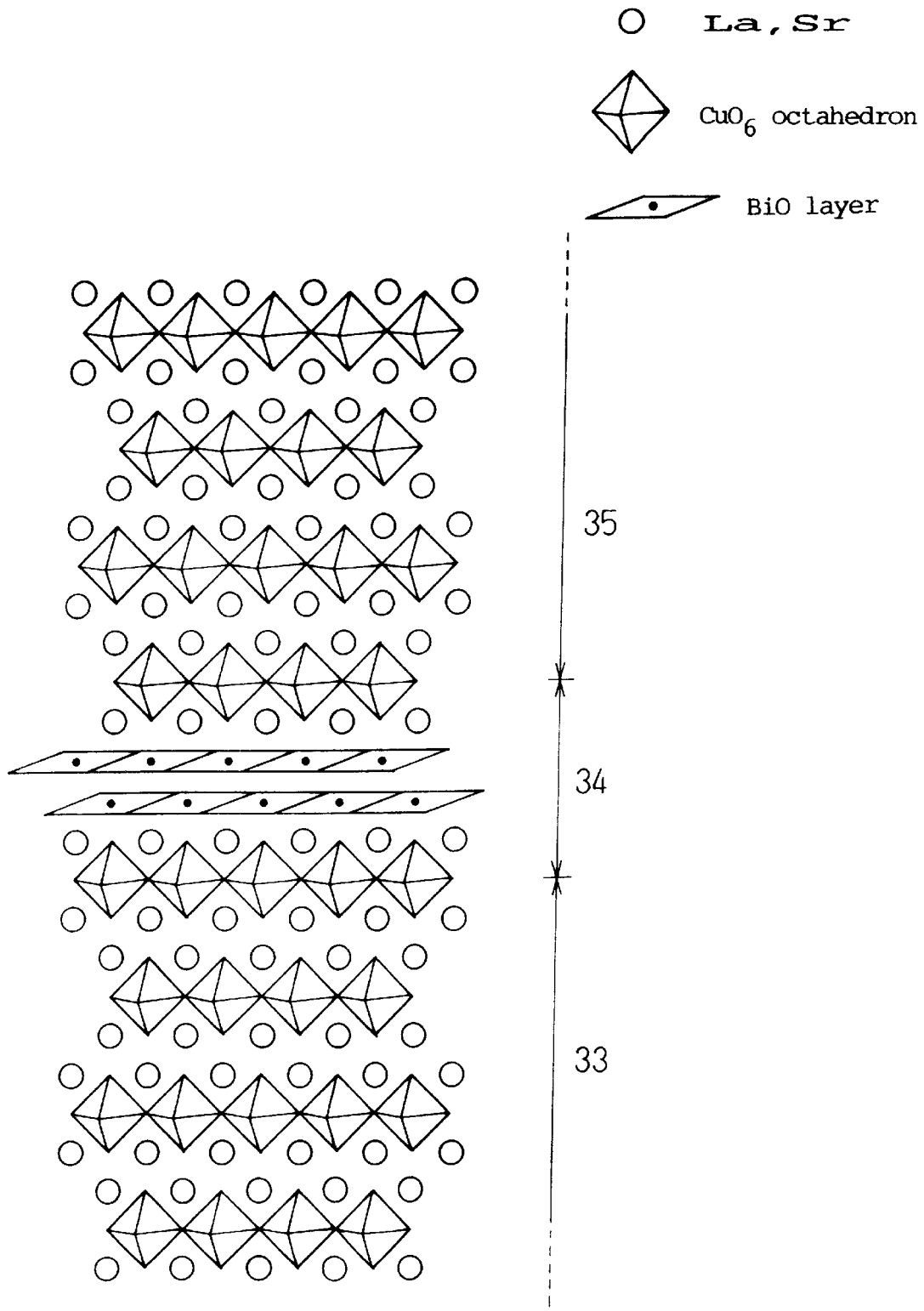
FIG. 4 is a schematic crystalline structure view showing near the junction part of a superconducting tunnel junction element in accordance with the present invention.

The crystalline structure near the junction part of the element with a barrier layer at a thickness of 1.2 nm was shown in FIG. 4. As seen in FIG. 4, the crystalline structures of the superconducting electrodes 33, 35 and the barrier layer 34 fit in well with each other. The conformity in structure is considered to make it possible to provide a satisfactory Josephson junction element including the copper oxide-based superconductor as well as the Josephson junction element including a metalic superconductor.

When applying other La-based superconductors such as $(La_{0.7}Sr_{0.3})_2CaCu_2O_6$ to the superconducting electrode, the same element as described above was produced. In such a case, the tunneling effect was able to be observed at a high temperature of 30K because of a higher Tc of the superconductors. In the case of substituting $Bi_2(La_{0.6}Sr_{0.4})_2CuO_6$ with $Bi_2(La_{0.6}Sr_{0.4})_2CaCu_2O_8$, the same effect was observed. Though another rare element was able to substitute La in the barrier layer to provide a satisfactory element, the barrier layer including La provided the good producibility. Other alkali earth elements were also able to apply to the element.

Example 4

A superconducting tunnel element was produced out of $(Nd_{0.8}Ce_{0.2})_2CuO_4$ (Tc=30K) as a compound for superconducting electrodes and $Bi_2Sr_2CuO_6$ as a compound for a barrier layer by the same process as described in Example 3. The thickness of the barrier layer was 2.4 nm. The thin films were heat-treated at 500° C. in the atmosphere of nitrogen as a reducing treatment to improve the superconductivity of the superconducting electrodes. The electrical resistance of the $(Nd_{0.8}Ce_{0.2})_2CuO_4$ electrode was zero at 25K. A typical Josephson effect with a clear hysteresis curve was found at 10K, when measuring voltage-current characteristics between the two electrodes of the element. That means the structural matching between the superconductor and the Bi-based barrier layer was also good.

When substituting the superconductor with $(Pr_{0.8}Ce_{0.2})_2CuO_4$ or $(Nd_{0.8}Sr_{0.1}Ce_{0.1})_2CuO_4$, the same effect as described above was observed.

Example 5

A superconducting tunnel element was produced out of $YBa_2Cu_3O_7$ as a compound for superconducting electrodes and $Bi_2Sr_2(Ca_{0.6}Y_{0.4})Cu_2O_8$ as a compound for a barrier layer. The compound for superconducting electrodes, one of the superconductors what is called a 123 structure superconductor represented by the formula of $R'Ba_2Cu_3O_7$, wherein R' represents rare earth element, has a Tc of 94K.

The layered film was produced by sputtering in the order of a $YBa_2Cu_3O_7$ thin film to a thickness of 300 nm as the lower electrode, a $Bi_2Sr_2(Ca_{0.6}Y_{0.4})Cu_2O_8$ thin film to a thickness of 10 nm as the barrier layer, a $YBa_2Cu_3O_7$ thin film to a thickness of 50 nm as the upper electrode on the (100) plane of $SrTiO_3$. It was hard to produce the thin films with good crystallinity, because impurities often appeared and the orientation of the crystals was often disordered. In the case of substituting $R'Ba_2Cu_3O_7$ with a $HgBa_2Ca_{n-1}CuO_{2n+3}$ superconductor, the same problem as described above was not able to be solved. The problem was supposed to arise from a stable impurity layer of Ba with Bi (Ba–Bi–O).

Figure 5:
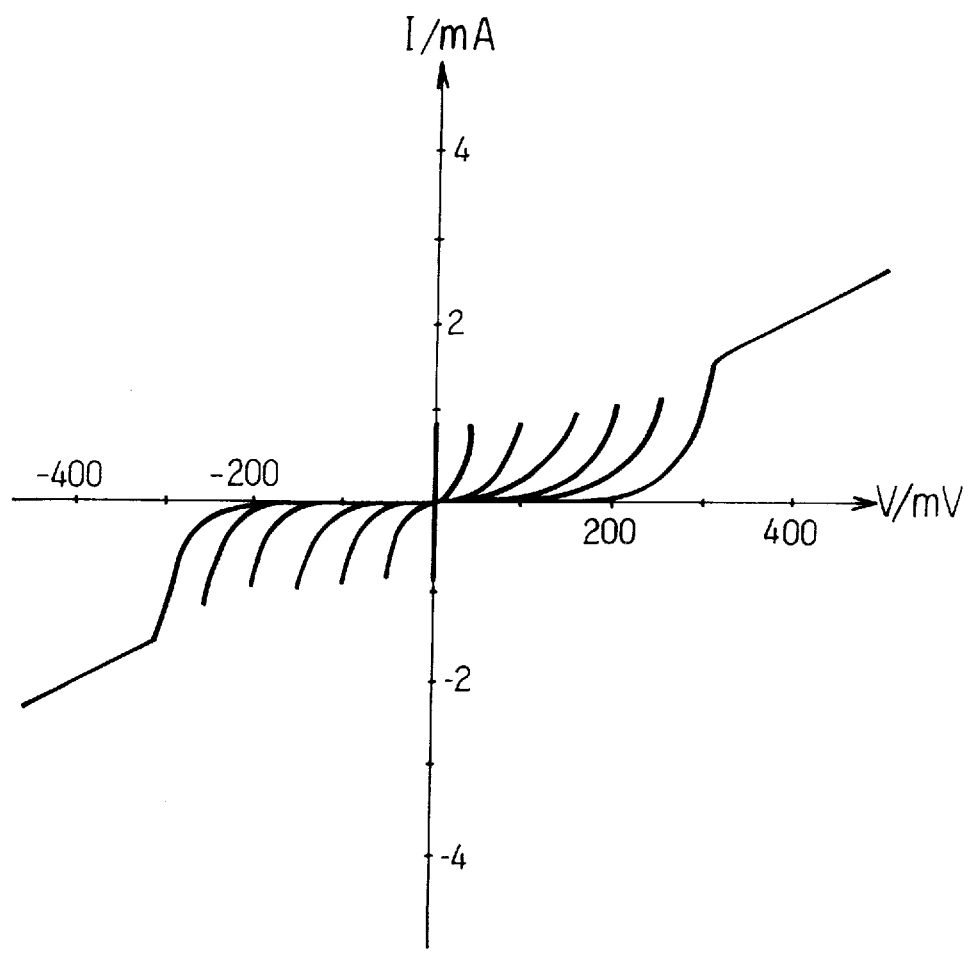
FIG. 5 is a graph showing V–I curve of a superconducting tunnel junction element in accordance with the present invention.

Not a few thin layers were inserted between the two electrodes to stabilize the structure of the thin films. As a result, $La_2CuO_4$, $Sr_2CuO_3$ and their solid solutions were found to stabilize the thin films to obtain satisfactory superconductivity. For example, the layered film was produced by sputtering in the order of a $YBa_2Cu_3O_7$ thin film to a thickness of 300 nm as the lower electrode, a $La_2CuO_4$ thin film to a thickness of 2 nm as the first layer for structural stabilization, a $Bi_2Sr_2(Ca_{0.6}Y_{0.4})Cu_2O_8$ thin film to a thickness of 10 nm as the barrier layer, a $La_2CuO_4$ thin film to a thickness of 2 nm as the second layer for structural stabilization, a $YBa_2Cu_3O_7$ thin film to a thickness of 50 nm as the upper electrode on the (100) plane of $SrTiO_3$. It was confirmed that the c-crystallographic axes in all the thin films were perpendicular to the surface of the substrate. The junction part with an area of 2 $\mu m \times 2$ $\mu m$ was cut out to produce the element by the same process as described above. A typical Josephson effect with a clear hysteresis curve was found at 80K, when measuring voltage-current characteristics between the two electrodes of the element. The characteristics of the element at 4.2K was shown in FIG. 5. As seen in FIG. 5, six hysteresis curves were observed corresponding to the thicker barrier layer at a thickness of 10 nm. The structural and chemical matching among the superconductor, the Bi-based barrier layer and the layer between the two layers was supposed to be so good that the satisfactory effect and the sufficient reproducibility was obtained. The layers for structural stabilization at a thickness between 0.7 nm and 10 nm were preferred, viewed in both the structural stabilization and superconductivity.

When substituting Y with another rare earth element or calcium, the same effect as described above was observed, because the good matching was maintained. In the case of substituting $La_2CuO_4$ with $Sr_2CuO_3$ or their solid solutions represented by the formula of $(La,Sr)_2CuO_{3+f}$ which have the same structure as that of $La_2CuO_4$, the same effect as described above was observed.

In Examples 1–4, $SrTiO_3$ was applied to the barrier layers to produce the elements. No tunnel junction effects were observed, but leaking currents in some cases.

We claim:

1. A superconducting tunnel junction element which comprises:
   a pair of superconducting electrodes, each comprising a composite oxide as a main component, wherein the composite oxide in each of the superconducting electrodes is represented by the following formula:

$R^1Sr_2Cu_{3-x}M_xO_{7-d}$, wherein $R^1$ represents at least one rare earth element, M represents at least one element selected from the group consisting of Mo, W, Re, Ge, Fe, Co, Cr and Ti, x represents a numerical value between zero and one and d represents a numerical value between zero and one; and
   a barrier layer between the electrodes, comprising a composite oxide as a main component represented by the following formula:

$Bi_2A_{m+1}Cu_mO_{2m+4}$, wherein A represents at least one alkali earth element and m represents an integer between one and four.

2. A superconducting tunnel junction element according to claim 1, wherein the thickness of the barrier layer is between 1 nm and 20 nm.

3. A superconducting tunnel junction element according to claim 1, wherein a part of $R^1$ is substituted with Ca.

4. A superconducting tunnel junction element which comprises:
   a pair of superconducting electrodes, each comprising a composite oxide as a main component, wherein the composite oxide in each of the superconducting electrodes is represented by the following formula:

$Sr_2Ca_{n-1}Cu_nO_{2n+2}$, wherein n represents an integer between one and five; and
   a barrier layer between the electrodes, comprising a composite oxide as a main component represented by the following formula:

$Bi_2A_{m+1}Cu_mO_{2m+4}$, wherein A represents at least one alkali earth element and m represents an integer between one and four.

5. A superconducting tunnel junction element according to claim 4, wherein at least a part of Ca is substituted with Sr.

6. A superconducting tunnel junction element according to claim 4, wherein a part of oxygen is substituted with at least one element selected from the group consisting of F, Cl and Br.

7. A superconducting tunnel junction element according to claim 4, wherein at least a part of Sr is substituted with at least one rare earth element.

8. A superconducting tunnel junction element according to claim 7, wherein the rare earth element is selected from the group consisting of La, Nd and Pr.

9. A superconducting tunnel junction element according to claim 4, wherein the thickness of the barrier layer is between 1 nm and 20 nm.

10. A superconducting element according to claim 4, wherein a part of alkali earth element is substituted with at least one rare earth element.

11. A superconducting tunnel junction element which comprises:
    a pair of superconducting electrodes, each comprising a composite oxide as a main component; and
    a barrier layer between the electrodes, comprising a composite oxide as a main component represented by the following formula:

$Bi_2A_{m+1}Cu_mO_{2m+4}$, wherein A represents at least one alkali earth element and m represents an integer between one and four,
    wherein a layer for structural stabilization is formed between the superconducting electrode and the barrier layer.

12. A superconducting tunnel junction element according to claim 11, wherein the layer for structural stabilization is free from Ba.

13. A superconducting tunnel junction element according to claim 11, wherein the layer for structural stabilization comprises a composite oxide as a main component represented by the following formula:

$L_2CuO_{3+f}$, wherein L represents at least one element selected from the group of La and Sr and f represents a numerical value between zero and 1.2.

14. A superconducting tunnel junction element according to claim 11, wherein the composite oxide in each of the superconducting electrodes is represented by the following formula:

$R^2Ba_2Cu_3O_{7-e}$, wherein $R^2$ represents at least one rare earth element and e represents a numerical value between zero and one.

15. A superconducting tunnel junction element according to claim 11, wherein the layer for structural stabilization is thinner than the barrier layer.

16. A superconducting tunnel junction element according to claim 11, wherein the thickness of the layer for structural stabilization is between 0.7 nm and 10 nm.

17. A superconducting tunnel junction element according to claim 1, wherein a part of alkali earth element is substituted with at least one rare earth element.

18. A superconducting tunnel junction element according to claim 11, wherein the thickness of the barrier layer is between 1 nm and 20 nm.

19. A superconducting element according to claim 11, wherein a part of alkali earth element is substituted with at least one rare earth element.

20. A superconducting device comprising a superconducting tunnel junction element which comprises:

a pair of superconducting electrodes, each comprising a composite oxide as a main component, wherein the composite oxide in each of the superconducting electrodes is represented by the following formula:

$$R^1Sr_2Cu_{3-x}M_xO_{7-d},$$

wherein $R^1$ represents at least one rare earth element, M represents at least one element selected from the group consisting of Mo, W, Re, Ge, Fe, Co, Cr and Ti, x represents a numerical value between zero and one and d represents a numerical value between zero and one; and a barrier layer between the electrodes, comprising a composite oxide as a main component represented by the following formula:

$$Bi_2A_{m+1}CU_mO_{2m+4},$$

wherein A represents at least one alkali earth element and m represents an integer between one and four.

21. A superconducting device comprising a superconducting tunnel junction element which comprises:

a pair of superconducting electrodes, each comprising a composite oxide as a main component, wherein the composite oxide in each of the superconducting electrodes is represented by the following formula:

$$Sr_2Ca_{n-1}Cu_nO_{2n+2},$$

wherein n represents an integer between one and five; and a barrier layer between the electrodes, comprising a composite oxide as a main component represented by the following formula:

$$Bi_2A_{m+1}CU_mO_{2m+4},$$

wherein A represents at least one alkali earth element and m represents an integer between one and four.

22. A superconducting device comprising a superconducting tunnel junction element which comprises:

a pair of superconducting electrodes, each comprising a composite oxide as a main component; and a barrier layer between the electrodes, comprising a composite oxide as a main component represented by the following formula:

$$Bi_2A_{m+1}CU_mO_{2m+4},$$

wherein A represents at least one alkali earth element and m represents an integer between one and four, wherein a layer for structural stabilization is formed between the superconducting electrode and the barrier layer.

* * * * *